(12) United States Patent
Rosales et al.

(10) Patent No.: US 9,918,407 B2
(45) Date of Patent: Mar. 13, 2018

(54) MULTI-LAYER HEAT DISSIPATING DEVICE COMPRISING HEAT STORAGE CAPABILITIES, FOR AN ELECTRONIC DEVICE

(71) Applicant: QUALCOMM Incorporated, San Diego, CA (US)

(72) Inventors: Jorge Rosales, San Diego, CA (US); Victor Chiriac, Phoenix, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/226,727

(22) Filed: Aug. 2, 2016

(65) Prior Publication Data

US 2018/0042139 A1 Feb. 8, 2018

(51) Int. Cl.
*H05K 7/20* (2006.01)
*H05K 1/02* (2006.01)
(Continued)

(52) U.S. Cl.
CPC ..... *H05K 7/20509* (2013.01); *H01L 23/4275* (2013.01); *H05K 1/0203* (2013.01);
(Continued)

(58) Field of Classification Search
CPC . G06F 1/181–1/182; H05K 7/20218–7/20381;
(Continued)

(56) References Cited

U.S. PATENT DOCUMENTS 8,451,600 B1 * 5/2013 Ross ............... H05K 7/20736
165/80.3
9,024,434 B2 5/2015 Im et al.
(Continued)

FOREIGN PATENT DOCUMENTS

EP 2154938 A2 2/2010
JP 2004198036 A 7/2004
(Continued)

OTHER PUBLICATIONS

International Search Report and Written Opinion—PCT/US2017/041780—ISA/EPO—dated Oct. 17, 2017.

*Primary Examiner* — Anthony Haughton
*Assistant Examiner* — Razmeen Gafur
(74) *Attorney, Agent, or Firm* — Loza & Loza, LLP/Qualcomm

(57) ABSTRACT

A heat dissipating device that includes a first heat spreader layer, a second heat spreader layer, a first spacer, a second spacer, a first phase change material (PCM), and a second phase change material (PCM). The first heat spreader layer includes a first spreader surface and a second spreader surface. The second heat spreader layer includes a third spreader surface and a fourth spreader surface. The first spacer is coupled to the first heat spreader layer and the second heat spreader layer. The second spacer is coupled to the first heat spreader layer and the second heat spreader layer. The first PCM is located between the first heat spreader layer and the second heat spreader layer. The first PCM is surrounded by the first spacer. The second PCM is between the first heat spreader layer, the second heat spreader layer, the first spacer and the second spacer.

27 Claims, 13 Drawing Sheets

PROFILE VIEW

(51) Int. Cl.
*H01L 23/427* (2006.01)
*H01L 23/473* (2006.01)

(52) U.S. Cl.
CPC ......... *H05K 7/2029* (2013.01); *H05K 7/2099* (2013.01); *H05K 7/20436* (2013.01)

(58) Field of Classification Search
CPC .................. H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 9,136,202 B2 | 9/2015 | Chiriac et al. | |
| 9,226,428 B2 | 12/2015 | Pidwerbecki et al. | |
| 2002/0033247 A1* | 3/2002 | Neuschutz | F28D 20/02 165/10 |
| 2003/0047803 A1* | 3/2003 | Gektin | H01L 21/4882 257/719 |
| 2004/0017661 A1* | 1/2004 | Siegel | H01L 23/3121 361/705 |
| 2005/0007740 A1 | 1/2005 | Neuschuetz et al. | |
| 2005/0133907 A1* | 6/2005 | Hildner | H01L 23/36 257/717 |
| 2005/0174738 A1* | 8/2005 | Lam | H01L 23/36 361/704 |
| 2006/0278370 A1* | 12/2006 | Rockenfeller | H01L 23/427 165/104.33 |
| 2008/0001284 A1* | 1/2008 | Yuen | H01L 23/373 257/712 |
| 2008/0019097 A1* | 1/2008 | Zhang | F28F 13/00 361/704 |
| 2008/0266786 A1* | 10/2008 | Jafari | H01L 23/42 361/688 |
| 2010/0126708 A1 | 5/2010 | Mikami | |
| 2010/0273041 A1* | 10/2010 | Lawall | H01M 2/1072 429/120 |
| 2011/0103020 A1* | 5/2011 | Dangelo | B82Y 10/00 361/709 |
| 2011/0120673 A1* | 5/2011 | Xiang | C09K 5/063 165/104.25 |
| 2012/0045378 A1* | 2/2012 | Soukhojak | B01B 1/005 423/212 |
| 2012/0073619 A1* | 3/2012 | Moors | H01L 35/30 136/201 |
| 2012/0085527 A1* | 4/2012 | Pfaffinger | H01L 23/4006 165/185 |
| 2012/0276327 A1* | 11/2012 | Cola | B01J 23/745 428/119 |
| 2013/0082391 A1* | 4/2013 | Crisp | H01L 23/49816 257/773 |
| 2013/0270721 A1 | 10/2013 | Chiriac et al. | |
| 2013/0286592 A1* | 10/2013 | Tsuduki | H01L 23/055 361/707 |
| 2014/0246770 A1* | 9/2014 | Jha | H01L 23/3736 257/712 |
| 2014/0317389 A1 | 10/2014 | Wenisch et al. | |
| 2015/0115434 A1* | 4/2015 | Zohni | H01L 23/433 257/712 |
| 2015/0268704 A1 | 9/2015 | Chiriac et al. | |
| 2015/0279431 A1* | 10/2015 | Li | H01L 25/50 365/51 |
| 2015/0279828 A1* | 10/2015 | Koopmans | H01L 25/18 257/713 |
| 2015/0319886 A1* | 11/2015 | Albrecht, III | H05K 1/0203 361/709 |
| 2015/0333026 A1* | 11/2015 | Gandhi | H01L 23/4012 257/737 |
| 2015/0342023 A1* | 11/2015 | Refai-Ahmed | H05K 1/0203 361/696 |
| 2015/0348954 A1* | 12/2015 | Chandolu | H01L 25/50 257/712 |
| 2015/0382444 A1* | 12/2015 | Lin | H01L 23/3677 361/709 |
| 2016/0035648 A1* | 2/2016 | Zhou | H01L 23/3738 257/713 |
| 2016/0093598 A1* | 3/2016 | Jo | H01L 25/18 257/713 |

FOREIGN PATENT DOCUMENTS

| | | |
|---|---|---|
| KR | 20140092543 A | 7/2014 |
| KR | 20150047759 A | 5/2015 |
| KR | 20150047760 A | 5/2015 |
| WO | WO-2016077619 A1 | 5/2016 |

* cited by examiner

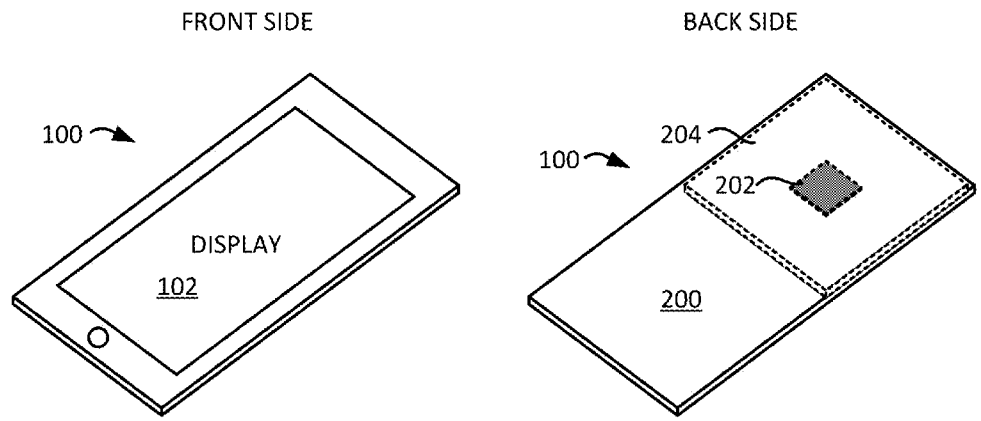
PRIOR ART FIG. 1
PRIOR ART FIG. 2
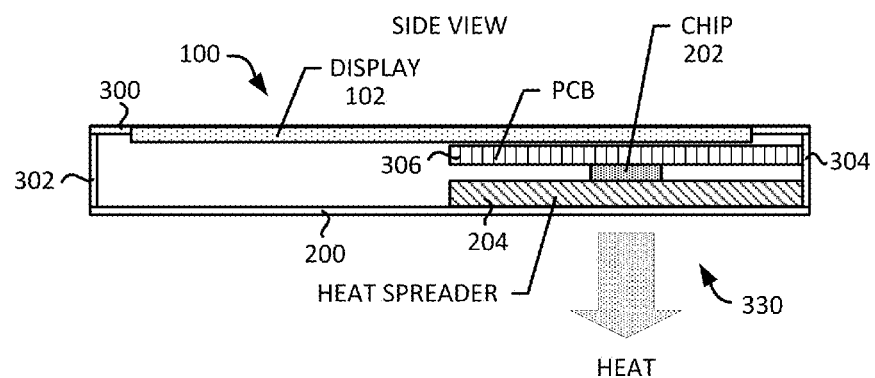
PRIOR ART FIG. 3

TRANSIENT JUNCTION TEMPERATURE
(E.G., TEMPERATURE AT INTEGRATED DEVICE)

MULTI-LAYER HEAT DISSIPATING DEVICE COMPRISING HEAT STORAGE CAPABILITIES, FOR AN ELECTRONIC DEVICE

BACKGROUND

Field

Various features relate to a multi-layer heat dissipating device for an electronic device, more specifically to a multi-layer heat dissipating device that includes heat storage capabilities.

Background

Electronic devices include internal components that generate heat. Some of these internal components include a central processing unit (CPU), a graphics processing unit (GPU) and/or memory. Some of these internal components can generate a lot of heat. Specifically, high performance CPUs and/or GPUs of an electronic device can generate a lot of heat, especially when performing data intensive operations (e.g., games, processing video).

To counter or dissipate the heat generated by the CPU and/or GPU, an electronic device may include a heat dissipating device, such as a heat spreader. FIGS. 1-3 illustrate an example of a mobile device that includes a heat spreader for dissipating heat generated by a chip. As shown in FIGS. 1 and 2, the mobile device 100 includes a display 102, a back side surface 200, a die 202, and a heat spreader 204. The die 202 and the heat spreader 204, which are both shown with dotted lines, are located inside the mobile device 100. The die 202 is coupled to a first surface of the heat spreader 204. A second surface of the heat spreader 204 is coupled to a first surface (e.g., inner surface) of the back side surface 200.

FIG. 3 illustrates a profile view of the mobile device 100 that includes the heat spreader 204. As shown in FIG. 3, the mobile device 100 includes the display 102, the back side surface 200, a front side surface 300, a bottom side surface 302, and a top side surface 304. FIG. 3 also illustrates a printed circuit board (PCB) 306, the die 202 and the heat spreader 204 inside the mobile device 100.

As further shown in FIG. 3, a first side of the die 202 is coupled to a first surface of the PCB 306. A second side of the die 202 is coupled to a first surface of the heat spreader 204. A second surface of the heat spreader 204 is coupled to a first surface (e.g., inner surface) of the back side surface 200. In this configuration, most of the heat that is generated by the die 202, is dissipated through the heat spreader 204 and the back side surface 200 of the mobile device. In many instances, this will cause the back side surface 200 to heat up to a temperature that is higher than was is comfortable and/or acceptable to a user (e.g., person) holding the mobile device. In some instances, the temperature of the back side surface 200 of the mobile device may be even hot enough to burn a user touching and/or holding the mobile device 100.

Therefore, there is a need for an improved method and design for efficiently dissipating heat from an electronic device (e.g., mobile device), while at the same time keeping the temperature of the outer surface of the electronic device within a threshold that is acceptable to a user of the electronic device.

SUMMARY

Various apparatus and methods described herein provide a multi-layer heat dissipating apparatus for an electronic device.

An example provides a heat dissipating device that includes a first heat spreader layer, a second heat spreader layer, a first spacer and a first phase change material (PCM). The first spacer is coupled to the first heat spreader layer and the second heat spreader layer. The first phase change material (PCM) is located between the first heat spreader layer, the second heat spreader layer and the first spacer.

Another example provides an apparatus that includes a first means for spreading heat, a second means for spreading heat, a first spacer and a first means for storing heat. The first spacer is coupled to the first means for spreading heat and the second means for spreading heat. The first means for storing heat is located between the first means for spreading heat, the second means for spreading heat and the first spacer.

Another example provides a device that includes a region configured to generate heat, the region comprising an integrated device. The device also includes a first heat spreader layer coupled to the region, a second heat spreader layer, a first spacer coupled to the first heat spreader layer and the second heat spreader layer, and a first phase change material (PCM) located between the first heat spreader layer, the second heat spreader layer, and the first spacer.

DRAWINGS

Various features, nature and advantages may become apparent from the detailed description set forth below when taken in conjunction with the drawings in which like reference characters identify correspondingly throughout.

FIG. 1 illustrates a front view of a mobile device.

FIG. 2 illustrates a back view of a mobile device that includes a heat spreader.

FIG. 3 illustrates a profile view of a mobile device that includes a heat spreader.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may or may not be shown in block diagrams in order to avoid obscuring the aspects in unnecessary detail. In other instances, well-known circuits, structures and techniques may not be shown in detail in order not to obscure the aspects of the disclosure.

Overview

Some exemplary embodiments of this disclosure pertain to a multi-layer heat dissipating device that includes a first heat spreader layer, a second heat spreader layer, a first spacer, a second spacer, a first phase change material (PCM), and a second phase change material (PCM). The first heat spreader layer includes a first spreader surface and a second spreader surface. The second heat spreader layer includes a third spreader surface and a fourth spreader surface. The first spacer is coupled to the first heat spreader layer and the second heat spreader layer. The second spacer is coupled to the first heat spreader layer and the second heat spreader layer. The first phase change material (PCM) is located between the first heat spreader layer, the second heat spreader layer and the first spacer. The second phase change material (PCM) is between the first heat spreader layer, the second heat spreader layer, the first spacer and the second spacer. The PCMs are configured to provide heat storing capabilities for the multi-layer heat dissipating device, which stores heat that is dissipated away from a heat generating region and delays the release of the dissipated heat to another region. In some implementations, different PCMs may have different melting temperatures. In some implementations, the first PCM has a first melting temperature than is higher than a second melting temperature for the second PCM.

Exemplary Multi-Layer Heat Dissipating Device Comprising Phase Change Material (PCM)

Figure 4:
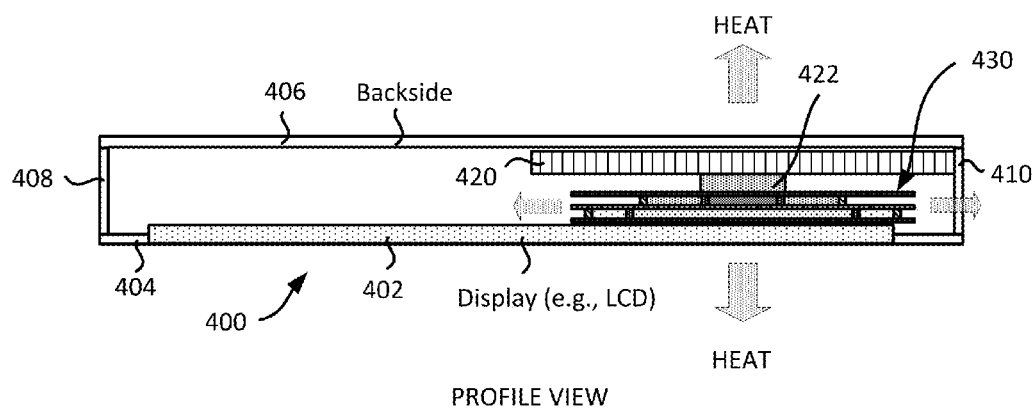
FIG. 4 illustrates a profile view of a mobile device that includes a multi-layer heat dissipating device, where the multi-layer heat dissipating device includes at least one phase change material (PCM).

FIG. 4 illustrates a device 400 (e.g., mobile device) that includes a display 402, a front side surface 404, a back side surface 406, a bottom side surface 408, and a top side surface 410. The device 400 also includes a printed circuit board (PCB) 420, an integrated device 422 (e.g., chip, die, die package, central processing unit (CPU), graphical processing unit (GPU)), and a multi-layer heat dissipating device 430. The integrated device 422 is coupled to the multi-layer heat dissipating device 430 and the PCB 420. In some implementations, the integrated device 422 is located in a region of the device 400 that is coupled to the multi-layer heat dissipating device 430. The region that includes the integrated device 422 and/or the PCB 420 may be a region that is configured to generate heat and/or a heat generating region of the device 400. The region may include the integrated device 422 and/or other heat generating components (e.g., heat source). As will be further described in FIG. 5, the multi-layer heat dissipating device 430 includes heat storing capabilities (e.g., means for storing heat, phase change material (PCM)) that allow the multi-layer heat dissipating device 430 to dissipate heat away from a region of the device and store (e.g., temporarily store) some of the dissipated heat. By storing at least some of the heat, the multi-layer heat dissipating device 430 provides a mechanism for delaying heat that is dissipated away through the back side or front side of the device 400. This mechanism allows the lowering of the peak temperatures of the front side, the back side, the integrated device, and/or the package of the device 400.

FIG. 4 illustrates the multi-layer heat dissipating device 430 in physical contact with the display 402 of the device 400 (e.g., electronic device, mobile device). In some implementations, a multi-layer heat dissipating device may be near (e.g., in close proximity of) the display 402 and/or the top side surface 410 of the device 400, but not in physical contact with the display 402 and/or the top side surface 410 of the device 400. However, different implementations may position the multi-layer heat dissipating device 430 in the device 400 differently. Another example of how the multi-layer heat dissipating device 430 may be positioned in the device 400 is described and illustrated in FIG. 7 below.

Figure 5:
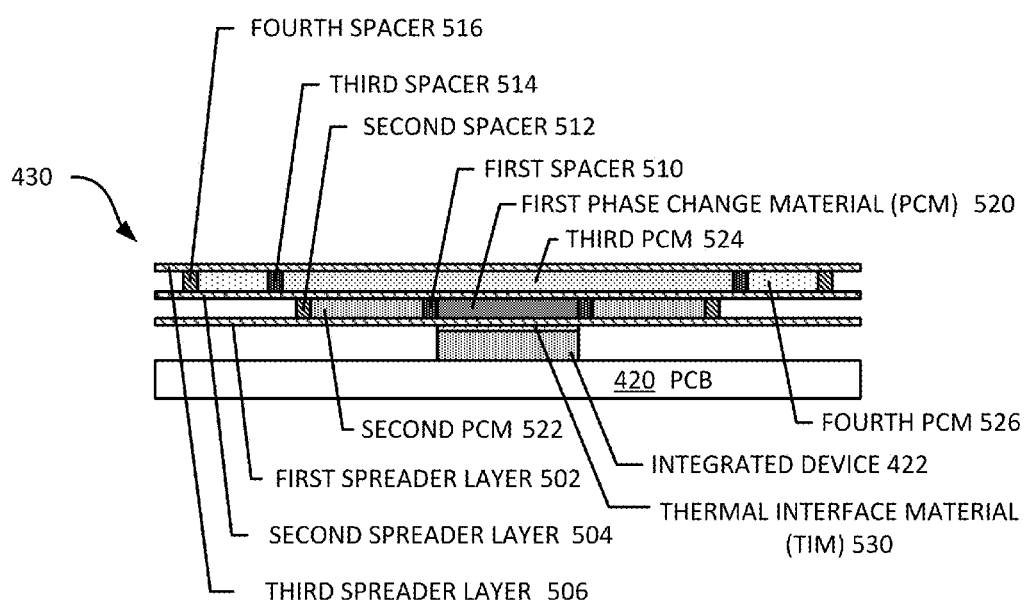
FIG. 5 illustrates a profile view of a multi-layer heat dissipating device that includes at least one phase change material (PCM).

FIG. 5 illustrates a close up view of the multi-layer heat dissipating device 430 of FIG. 4. The multi-layer heat dissipating device 430 is coupled to the integrated device 422 through a thermal interface material (TIM) 530. The integrated device 422 is coupled to the PCB 420. In some implementations, a region of the device that is configured to generate heat (e.g., heat generating region, heat source) may include the PCB 420, the integrated device 422 and/or the thermal interface material (TIM) 530.

The multi-layer heat dissipating device 430 includes a first heat spreader layer 502, a second heat spreader layer 504, a third heat spreader layer 506, a first spacer 510, a second spacer 512, a third spacer 514, a fourth spacer 516, a first phase change material (PCM) 520, a second phase change material (PCM) 522, a third phase change material (PCM) 524, and a fourth phase change material (PCM) 526. In some implementations, the first PCM 520, the second PCM 522, the third PCM 524 and/or the fourth PCM 526 may be configured as one or more means for storing heat (e.g., heat storing capabilities) for the multi-layer heat dissipating device 430. In some implementations, the PCMs are located in the multi-layer heat dissipating device 430 such that the PCMs do not mix with each other, which may help optimize the heat storing capabilities (e.g., by following the temperature gradient inside the device) of the multi-layer heat dissipating device 430.

Figure 13:
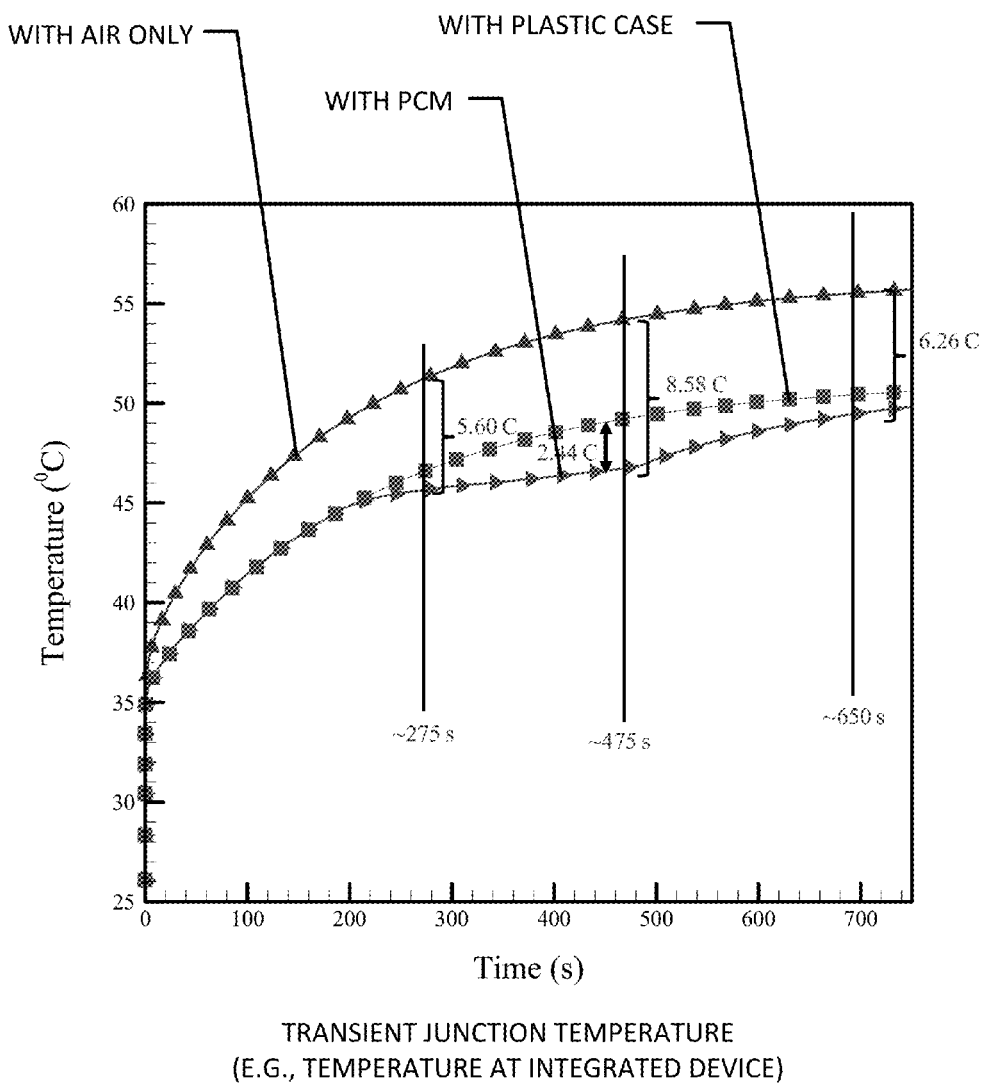
FIG. 13 illustrates a graph of temperature profile of an integrated device, over time, using various heat dissipating devices.
Figure 14:
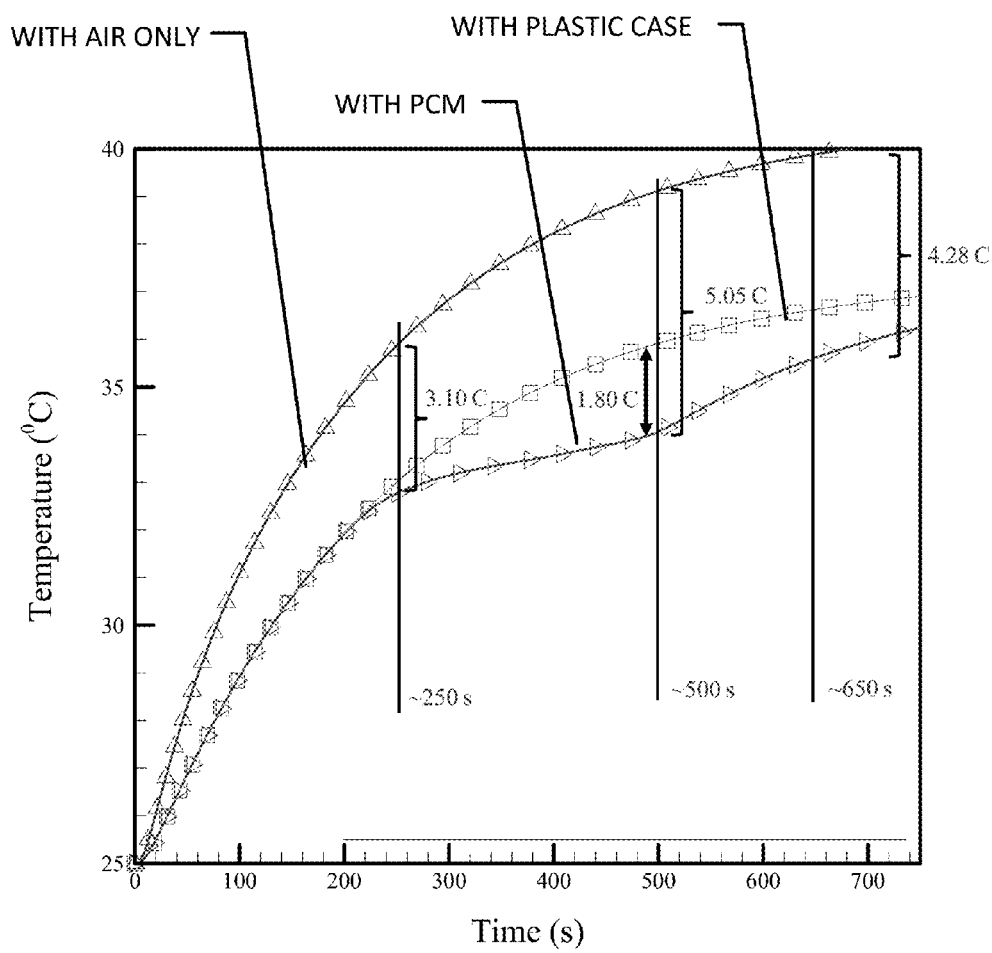
FIG. 14 illustrates a graph of temperature profile of a back cover, over time, using various heat dissipating devices.
Figure 15:
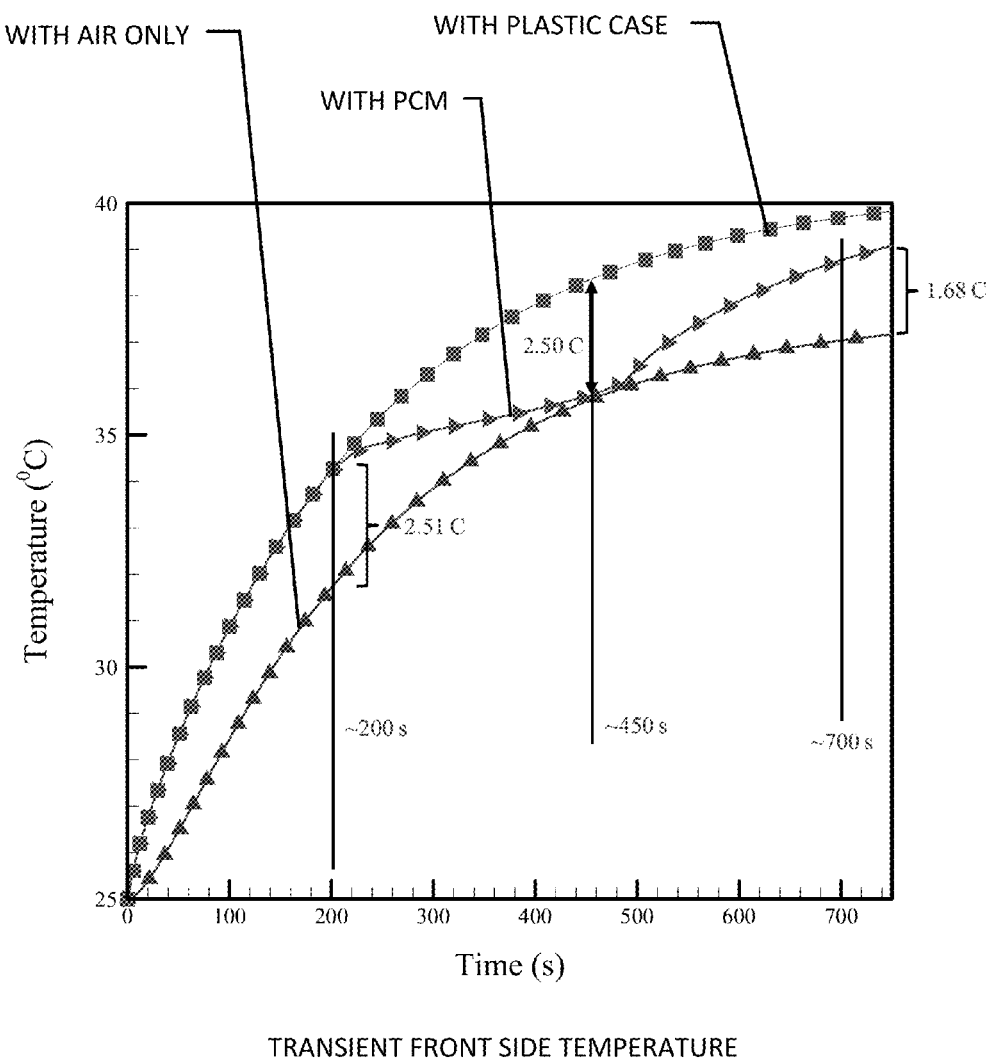
FIG. 15 illustrates a graph of temperature profile of a display, over time, using various heat dissipating devices.

In some implementations, the multi-layer heat dissipating device 430 may include PCMs with similar and/or different melting temperatures. FIGS. 6 and 13-15 illustrate how the heat storing capabilities of the multi-layer heat dissipating device 430 help dissipate heat from a region (e.g., heat generating region) that includes an integrated device while also helping preventing an external surface of the device from reaching a temperature that is uncomfortable to a user. For example, the PCMs enable heat that has been dissipated away from the integrated device 422 to be stored (e.g., temporarily stored) away from the integrated device 422, but which is not immediately released through the back side surface and/or front side (e.g., display side) of the device 400. Thus, the PCMs provide a storing and delay mechanism in how heat is dissipated. FIGS. 13-15 below further illustrate and describe how one or more PCMs affect the transient temperatures at various locations of a device that includes a heat source (e.g., CPU), a back cover, and a display (e.g., LCD).

As shown in FIG. 5, the first heat spreader layer 502 may be coupled to the integrated device 422 through the thermal interface material 530. In some implementations, the first heat spreader layer 502 includes a first spreader surface and a second spreader surface. The first surface spreader of the first heat spreader layer 502 is coupled to the integrated device 422 through the thermal interface material 530. It is noted that the thermal interface material (TIM) 530 is optional.

The first heat spreader layer 502 (e.g., first means for spreading heat) is coupled to the first spacer 510 and the second spacer 512. The first spacer 510 and the second spacer 512 are coupled to the second heat spreader layer 504 (e.g., second means for spreading heat). The first PCM 520 (e.g., first means for storing heat) is located between the first heat spreader layer 502 and the second heat spreader layer 504. The first PCM 520 is surrounded by the first heat spreader layer 502, the second heat spreader layer 504 and the first spacer 510. The coupling of the first heat spreader layer 502, the second heat spreader layer 504 and the first spacer 510 may provide a hermetically sealed region for the first PCM 520. In some implementations, the first, second and third heat spreader layers (e.g., 502, 504, 506) may be made of the same material or different materials.

The second PCM 522 (e.g., second means for storing heat) is located between (e.g., surrounded by) the first heat spreader layer 502, the second heat spreader layer 504, the first spacer 510 and the second spacer 512. The coupling of the first heat spreader layer 502, the second heat spreader layer 504, the first spacer 510 and the second spacer 512 may provide a hermetically sealed region for the second PCM 522. In some implementations, the first PCM 520 has a first melting temperature, and the second PCM 522 has a second melting temperature. In some implementations, the first PCM 520 is selected such that the first melting temperature is greater than the second melting temperature of the second PCM 522, to optimize the storage capabilities and follow the temperature gradient inside the device (e.g., near the heat generating region).

The third spacer 514 and the fourth spacer 516 are coupled to second heat spreader layer 504 (e.g., second means for spreading heat) and the third heat spreader layer 506 (e.g., third means for spreading heat). The third PCM 524 (e.g., third means for storing heat) is located between the second heat spreader layer 504 and the third heat spreader layer 506. The third PCM 524 is surrounded by the second heat spreader layer 504, the third heat spreader layer 506 and the third spacer 514. The coupling of the second heat spreader layer 504, the third heat spreader layer 506 and the third spacer 514 may provide a hermetically sealed region for the third PCM 524. In some implementations, the third PCM 524 has a third melting temperature. In some implementations, the third PCM 524 is selected such that the third melting temperature is less than the first melting temperature of the first PCM 520 and/or the second melting temperature of the second PCM 522. As mentioned above, this may be done to enable and optimize good storage capacity and follow the temperature gradient inside the device (e.g., near the heat generating region).

The fourth PCM 526 (e.g., fourth means for storing heat) is located between (e.g., surrounded by) the second heat spreader layer 504, the third heat spreader layer 506, the third spacer 514 and the fourth spacer 516. The coupling of the second heat spreader layer 504, the third heat spreader layer 506, the third spacer 514 and the fourth spacer 516 may provide a hermetically sealed region for the fourth PCM 526. In some implementations, the fourth PCM 526 has a fourth melting temperature. In some implementations, the fourth PCM 526 is selected such that the fourth melting temperature is less than the first melting temperature of the first PCM 520, the second melting temperature of the second PCM 522, and/or the third melting temperature of the third PCM 524. As mentioned above, this may be done to enable and optimize good storage capacity and follow the temperature gradient inside the device (e.g., near the heat generating region).

In some implementations, the first spacer 510, the second spacer 512, the third spacer 514 and/or the fourth spacer 516 include a thermally conductive adhesive. However, in some implementations, the above spacers may include a low conductivity material (e.g., insulative material) to help the heat spread laterally instead of quickly transferring the heat to a region that may be in contact with skin.

The multi-layer heat dissipating device 430 is configured in such a way that heat from a heat generating region and/or region configured to generate heat (e.g., region that includes the integrated device 422) dissipates vertically and laterally from the multi-layer heat dissipating device 430. For instance, heat from the heat generating region and/or region configured to generate heat may dissipate laterally from the first heat spreader layer 502.

As the heat is dissipated away from the heat generating region and/or region configured to generate heat, the dissipated heat may be stored in one or more of the first PCM 520, the second PCM 522, the third PCM 524 and/or the fourth PCM 526. Thus, heat may be dissipated away from the integrated device 422 and some of the dissipated heat may be stored in the first PCM 520, the second PCM 522, the third PCM 524 and/or the fourth PCM 526. Where some of the heat is stored will depend on the configurations (e.g., size, shape) and material used for the first PCM 520, the second PCM 522, the third PCM 524 and/or the fourth PCM 526. Different implementations may use similar or different phase change materials (PCMs) for the first PCM 520, the second PCM 522, the third PCM 524 and/or the fourth PCM 526. In some implementations, the PCMs may be selected such that PCMs that are farther away from the heat generating region or heat source (e.g., CPU) has a lower melting temperature than PCMs that are closer to the heat generating region or heat source, so as to follow the temperature gradient inside the device. For example, for optimal heat storage, the PCMs may be selected such as to have decreasing melting temperatures from the first PCM 520 to the fourth PCM 526, to follow the temperature gradient inside the device. By storing the dissipated heat, it helps prevent the heat from increasing the surface temperature of the device 400 (or slows down the heat from reaching the surface temperature), thus helping avoid the uncomfortable surface temperature of the device 400. This approach takes away heat from the heat generating region (e.g., region comprising integrated device 422), which allows the integrated device 422 to perform at the desired temperature, while at the same time keeps heat away from the surface of the device 400. As the heat is dissipated away from the integrated device 422, the heat is stored in the PCMs having gradually lower melting temperatures from the first PCM 520 to the fourth PCM 526, which follows the temperature gradient inside the device.

A phase change material (PCM) is a material that has high heat of fusion which, melting and solidifying at a certain temperature, is capable of storing and releasing large amounts of energy. Heat is absorbed or released when the material changes from solid to liquid and vice versa; thus, PCMs are classified as latent heat storage (LHS) units. Various PCMs have various melting temperatures when they change from solid to liquid.

Heat of fusion is the change in its enthalpy resulting from providing energy, typically heat, to a specific quantity of the substance to change its state from a solid to a liquid at constant pressure. This energy includes the contribution required to make room for any associated change in volume by displacing its environment against ambient pressure. The temperature at which the phase transition occurs is the melting point.

The 'enthalpy' of fusion is a latent heat, because during melting the introduction of heat cannot be observed as a temperature change, as the temperature remains approximately constant during the melting process. The latent heat of fusion is the enthalpy change of any amount of substance when it melts. When the heat of fusion is referenced to a unit of mass, it is usually called the specific heat of fusion, while the molar heat of fusion refers to the enthalpy change per amount of substance in moles.

The liquid phase has a higher internal energy than the solid phase. This means energy must be supplied to a solid in order to melt it and energy is released from a liquid when it solidifies, because the molecules in the liquid experience weaker intermolecular forces and so have a higher potential energy (a kind of bond-dissociation energy for intermolecular forces).

Figure 6:
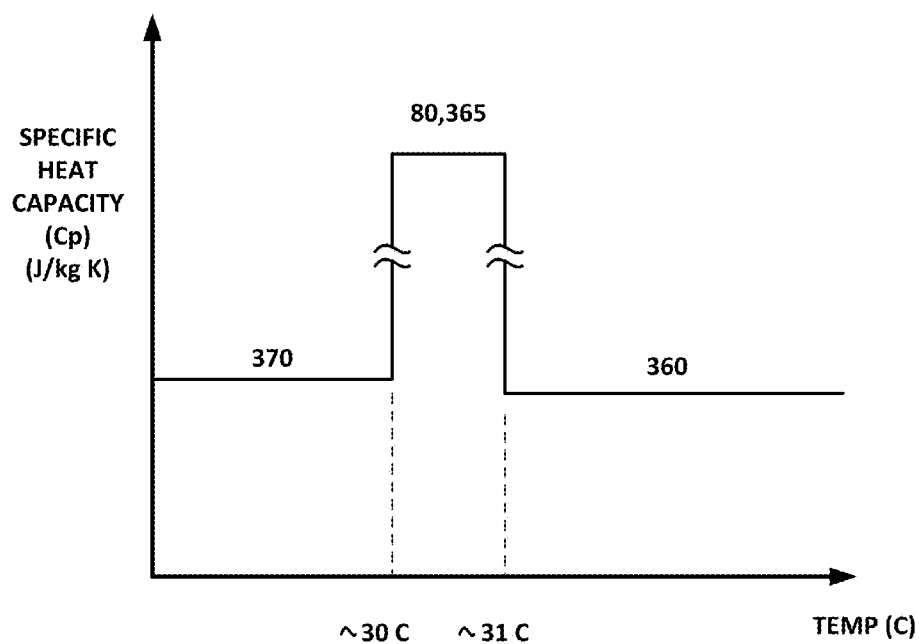
FIG. 6 illustrates a graph of a specific heat capacity for an exemplary phase change material (PCM) for various temperatures.

An example of how a phase change material (PCM) can help with heat storage can be illustrated by a specific heat capacity versus temperature plot. FIG. 6 illustrates a graph of the specific heat capacity (Cp) versus temperature of an exemplary phase change material (PCM). In particular, FIG. 6 illustrates a graph of the specific heat capacity of Gallium 1 (which is an example of a phase change material (PCM)) for various temperatures. As shown in FIG. 6, the specific heat capacity of Gallium 1 is about 370 for temperatures of about less than 30 Celsius, about 360 for temperatures of about greater than 31 Celsius, and about 80,000 for temperatures between about 30 Celsius and 31 Celsius. The phase change in the material is captured by the surge in the specific heat capacity of the material between 30 Celsius and 31 Celsius, and thus behaves like a large heat reservoir. Examples of different materials and properties for different phase change materials are further described below.

Different implementations may use the same or different materials for the first heat spreader layer 502, the second heat spreader layer 504, the third heat spreader layer 506, the fourth heat spreader layer 508, the first spacer 510, the second spacer 512, the third spacer 514, and the fourth spacer 516. For example, the first heat spreader layer 502, the second heat spreader layer 504, the third heat spreader layer 506, the fourth heat spreader layer 508, the first spacer 510, the second spacer 512, the third spacer 514, and the fourth spacer 516 may be made of a material that includes one of at least metal, carbon, graphite and/or aluminum. Similarly, the first heat spreader layer 502, the second heat spreader layer 504, the third heat spreader layer 506, the fourth heat spreader layer 508, the first spacer 510, the second spacer 512, the third spacer 514, and the fourth spacer 516 may have similar or different thermal conductivity values. A particular thermal conductivity value of a particular material quantifies how well or how poorly a particular material conducts heat.

In some implementations, the spacers (e.g., first spacer 510) are coupled to their respective heat spreader layers (e.g., first heat spreader layer 502) through an adhesive material (e.g., thermally conductive adhesive layer). Similarly, in some implementations, the heat spreader layers (e.g., first heat spreader layer 502) are coupled to their respective heat spreader layers (e.g., second heat spreader layer 504) through an adhesive material (e.g., thermally conductive adhesive layer). Different implementations may use different materials for the spacers (e.g., first spacer 510) and/or the adhesive material. Examples of materials for the spacers and/or the adhesive material (e.g., thermally conductive adhesive layer) include an epoxy or porous material (e.g., material with air gaps).

In some implementations, the spacers, the phase change materials (PCMs) and/or the adhesive material are configured to provide mechanical support for the multi-layer heat dissipating device 430.

The multi-layer heat dissipating device 430 has a first dimension, a second dimension, and a third dimension. In some implementations, the first dimension is a height of the multi-layer heat dissipating device, which may be along a Z-direction. In some implementations, the Z-direction is a vertical direction. In some implementations, a vertical direction is a direction along the multi-layer heat dissipating device 430 that travels (e.g., perpendicularly) the heat spreader layer(s) and the spacer. In some implementations, a vertical direction is a direction that is perpendicular or orthogonal to a surface of the heat spreader having the biggest surface area. In some implementations, the vertical direction is perpendicular or orthogonal to the top surface of an integrated device (e.g., die, chip), and/or printed circuit board (PCB).

In some implementations, the second dimension is a length of the multi-layer heat dissipating device, which may be along a Y-direction. In some implementations, the Y-direction is a lateral direction. In some implementations, the second dimension is a radius of the multi-layer heat dissipating device, which may be along a Y-direction.

In some implementations, the third dimension is a width of the multi-layer heat dissipating device, which may be along an X-direction. In some implementations, the X-direction is a lateral direction.

Figure 8:
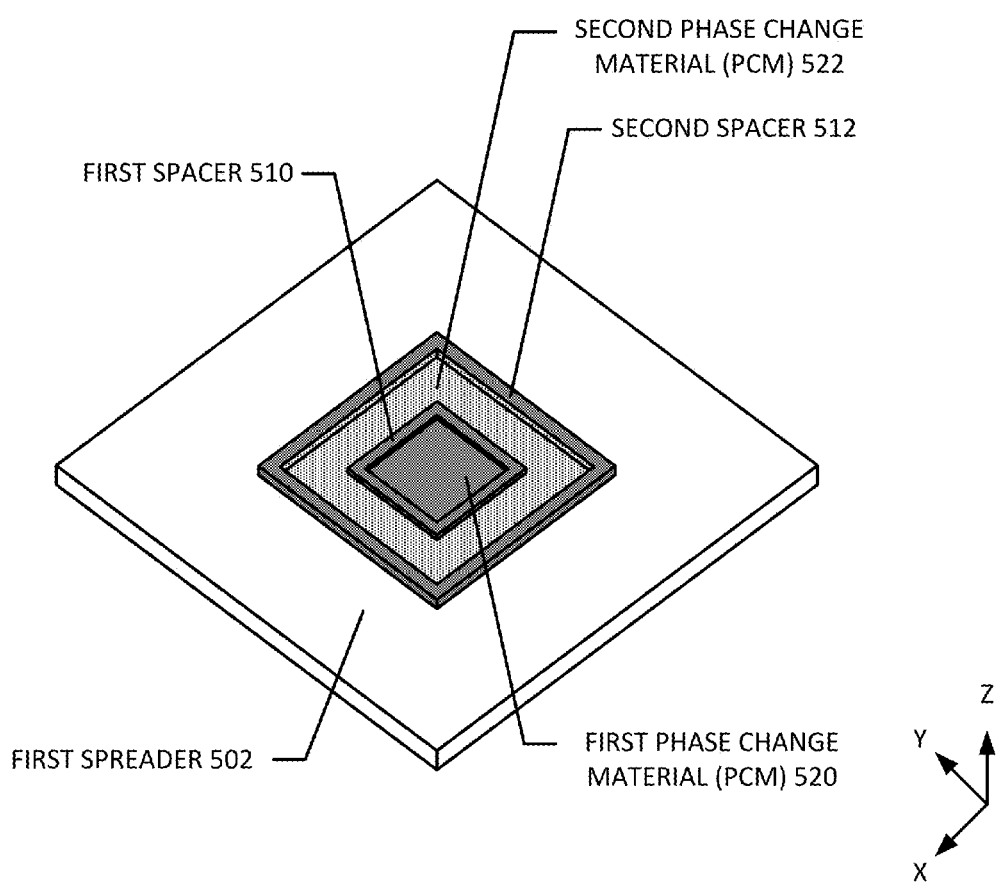
FIG. 8 illustrates a view of a first layer of a multi-layer heat dissipating device.
Figure 9:
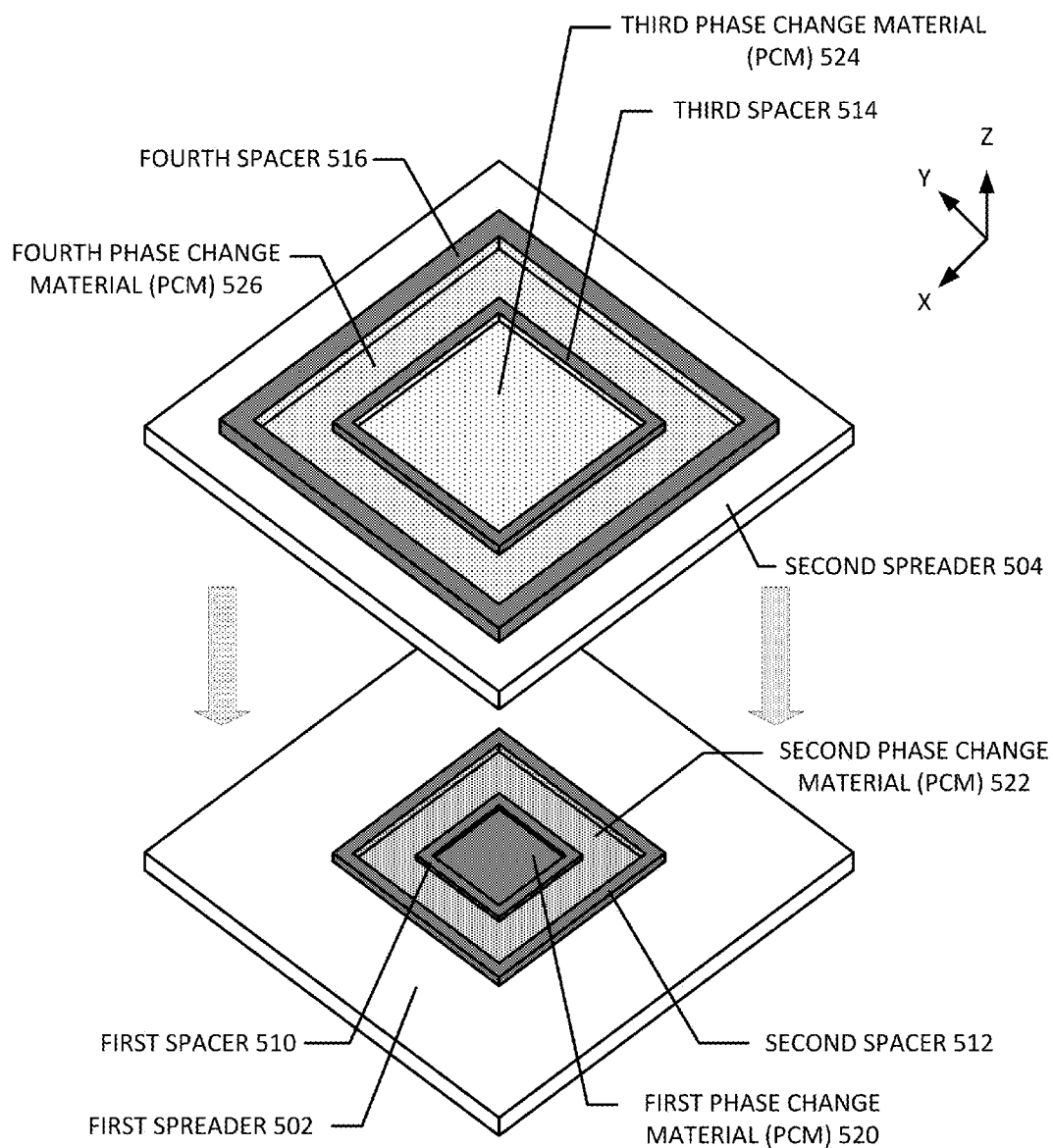
FIG. 9 illustrates an assembly view of a first layer and a second layer of a multi-layer heat dissipating device.
Figure 10:
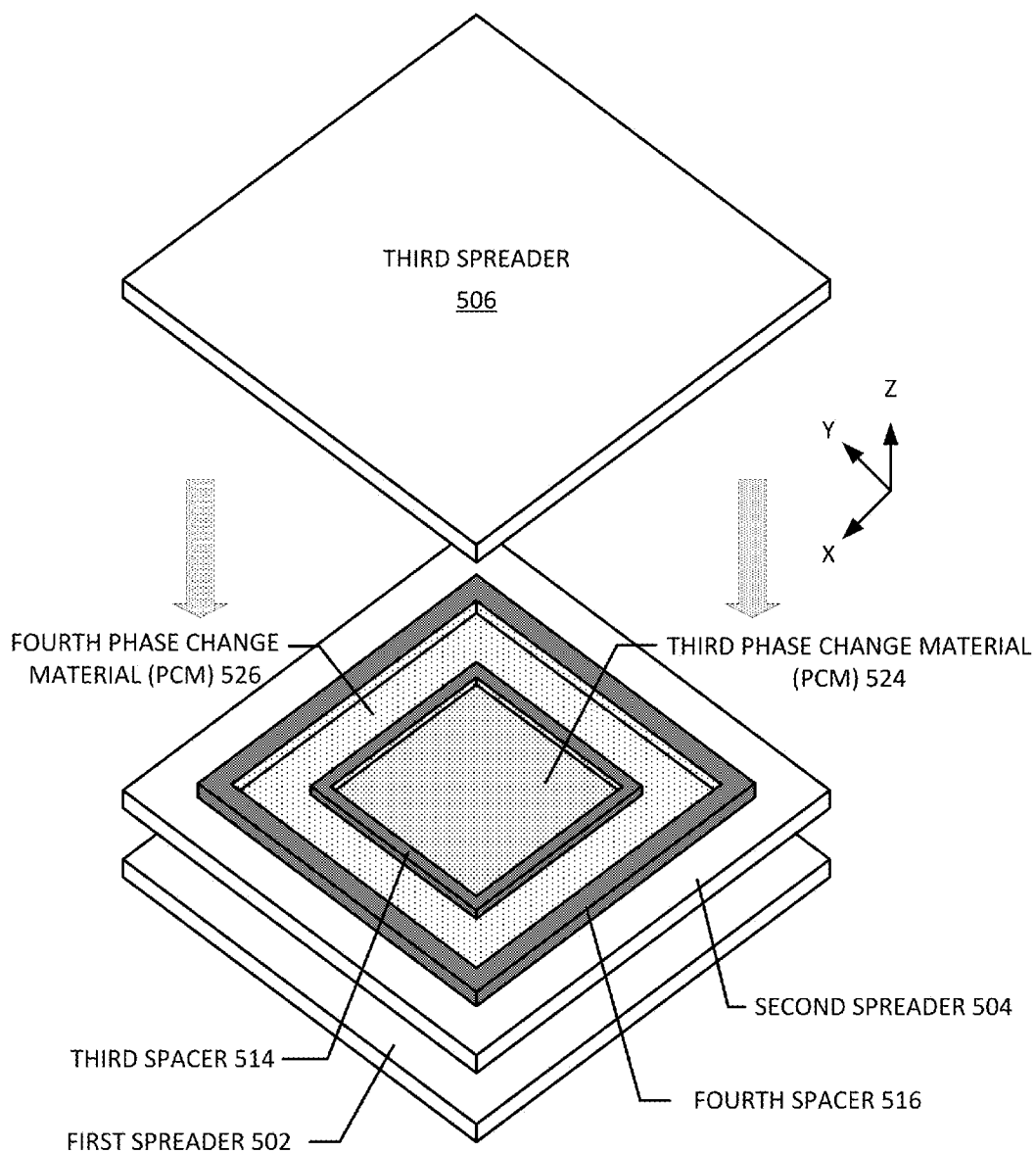
FIG. 10 illustrates an assembly view of a first layer, a second layer, and a third layer of a multi-layer heat dissipating device.

Examples of X, Y, Z dimensions and/or directions for a multi-layer heat dissipating devices are shown in at least FIGS. 8, 9 and 10.

In summary, FIGS. 4 and 5 illustrate an example of an apparatus (e.g., multi-layer heat dissipating device 430, device 400) that includes a means for spreading heat (e.g., first heat spreader layer 502) and a means for storing heat (e.g., first PCM 520). It is noted that different implementations may use different combinations or configurations of the heat spreader layer(s), the spacer(s) and/or the phase change materials (PCMs). For example, some implementations may include more or less heat spreader layer(s), more or less spacer(s), and/or more or less phase change materials (PCMs). Moreover, some implementations may use different sizes and shapes for the heat spreader layer(s), the spacer(s) and/or the phase change materials (PCMs). Thus, FIG. 5 is merely an example of a multi-layer heat dissipating device. Other heat dissipating devices may not include one or more heat spreader layers, one or more spacers and/or one or more phase change materials (PCMs). In some implementations, one or more space that is occupied by the PCMs may be left empty or in a vacuum.

Figure 7:
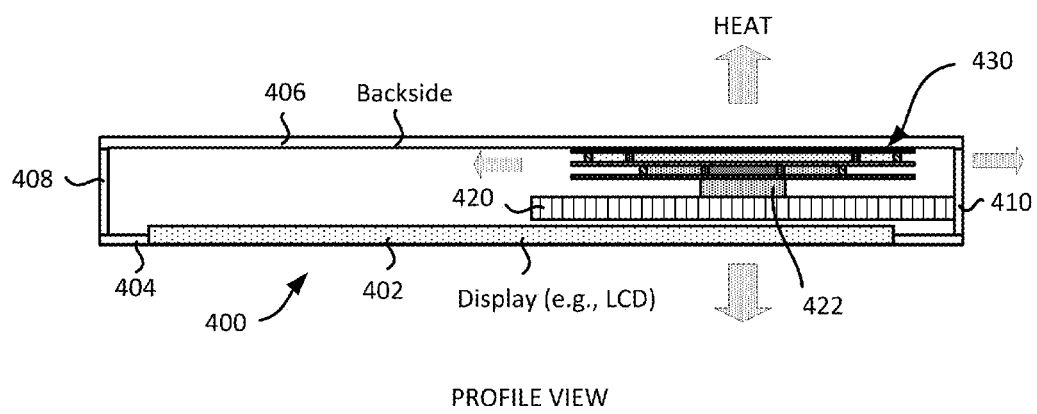
FIG. 7 illustrates a profile view of a mobile device that includes a multi-layer heat dissipating device, where the multi-layer heat dissipating device includes at least one phase change material (PCM).

FIG. 7 illustrates another example of how the multi-layer heat dissipating device 430 may be implemented in the device 400. As shown in FIG. 7, the multi-layer heat dissipating device 430 is coupled to the integrated device 422 such that the multi-layer heat dissipating device 430 is closer to the back side surface 406 of the device 400. The implementation of FIG. 7 is in contrast to the implementation of FIG. 4, which illustrates that the multi-layer heat dissipating device 430 is coupled to the integrated device 422 such that the multi-layer heat dissipating device 430 is closer to the display 402 of the device 400.

Having described various implementations of a multi-layer heat dissipating device that includes one or more phase change materials (PCMs), various examples of materials and their corresponding properties will now be described below.

Exemplary Materials and Thermal Conductivity Values

As mentioned above, different implementations may use similar or different materials for the phase change materials (PCMs), the heat spreader layers, the spacers, the thermal interface layers and/or the adhesive materials (e.g., thermally conductive adhesive layers).

In some implementations, the phase change materials (PCMs) are selected so as to store as much heat as possible and transfer it as far away as possible from the heat generating region (e.g., integrated device 422), while at the same time keeping heat away from a surface of the device 400 so as to prevent the heat from generating a back side or display side surface temperature that is uncomfortable for a user.

In some implementations, the first phase change material (PCM) 520 is made of a material that has a heat of fusion of about 200,000 J/kg and a melting point/melting temperature of about 37 Celsius. An example of the first phase change material (PCM) 520 includes paraffin wax. In some implementations, the second phase change material (PCM) 522 is made of a material that has a heat of fusion of about 200,000 J/kg and a melting point/melting temperature of about 35 Celsius. An example of the second phase change material (PCM) 522 includes high performance wax. In some implementations, the third phase change material (PCM) 524 is made of a material that has a heat of fusion of about 80,000 J/kg and a melting point/melting temperature of about 31 Celsius. An example of the third phase change material (PCM) 524 includes gallium. In some implementations, the fourth phase change material (PCM) 526 is made of a material that has a heat of fusion of about 80,000 J/kg and a melting point/melting temperature of about 29 Celsius. An example of the fourth phase change material (PCM) 526 includes gallium. The above listing of materials and properties are merely exemplary.

Table 1 below illustrates examples of various phase change materials (PCMs) and their associated properties.

TABLE 1

Exemplary Phase Change Materials (PCMs)

| | Paraffin | High Performance Wax | Gallium 1 | Gallium 2 |
|---|---|---|---|---|
| Thermal Conductivity (W/mk) | 0.25 | 5 | 35 | 30 |
| Phase Change Temperature (C.) | 37 | 35 | 31 | 29 |
| Latent Heat Fusion (J/kg) | 200000 | 200000 | 80000 | 80000 |
| Specific Heat (J/kg K) | 2500 | 2500 | 370 | 370 |
| Density (kg/m^3) | 900 | 900 | 6000 | 6000 |
| Thermal Diffusivity (m^2/s) | 1.11E−07 | 2.22E−06 | 1.58E−05 | 2.5E−05 |

It is noted that the above materials are merely exemplary. Different implementations may use different phase change materials (PCMs) and/or different combinations thereof. In addition, different implementations may select and utilize different arrangements of the PCMs in the heat dissipating device.

In some implementations, at least one of the heat spreader layer is made of a material that includes one of at least metal, carbon, graphite and/or aluminum. In some implementations, at least one of the heat spreader layers is made of a material with a high thermal conductivity value. In some implementations, at least one of the heat spreader layer has a thermal conductivity value of about 300 W/m·K or higher. In some implementations, at least one of the heat spreader layer has a thermal conductivity value of about 500 W/m-K or higher (e.g., graphite). In some implementations, a high thermal conductivity value is about 300 W/m·K or higher. In some implementations, the heat spreader layer may have a thermal conductivity value of about 300 W/m·K or higher.

In some implementations, a thermal interface layer is a material used to couple a heat spreader layer and an integrated device. Examples of thermal interfaces layers include solder, epoxy, metal filled attach, etc. . . . In some implementations, at least one of the thermal interface layers has a thermal conductivity value of about 1.5 W/m·K or less. In some implementations, at least one of the thermal interface layers has a thermal conductivity value of between about 0.7-1.5 W/m·K. In some implementations, the thermal interface layers may have a thermal conductivity value of about 7 W/m·K, for enhanced storage capabilities.

In some implementations, an adhesive material (e.g., thermally conductive adhesive layer) is a material used to couple a heat spreader layer and a spacer. In some implementations, at least one of the thermal interface layers has a thermal conductivity value that is about equal or greater than the thermal conductivity value of the spacer. In some implementations, at least one of the thermal interface layers has a thermal conductivity value that is about equal or less than the thermal conductivity value of the thermal interface layer.

It should be noted that the above heat fusion, melting temperatures, thermal conductivity values are merely examples, and the materials used in a multi-layer heat dissipating device are not limited to materials that have these values.

Exemplary Multi-Layer Heat Dissipating Device Comprising Phase Change Material (PCM)

Having described various implementations of a multi-layer heat dissipating device that includes one or more phase change materials (PCMs), a process for fabricating or assembling a multi-layer heat dissipating device will now be described below. FIGS. 8-11 illustrates a sequence and process for fabricating and assembling a multi-layer heat dissipating device and coupling the multi-layer heat dissipating device to an integrated device in a device (e.g., mobile device).

FIG. 8 illustrates a state after the first spacer 510 and the second spacer 512 are coupled to a second surface of the first heat spreader layer 502. An adhesive (e.g., thermally conductive adhesive, insulative adhesive) may be used to couple the first spacer 510 and the second spacer 512 to the first heat spreader layer 502. In some implementations, the first spacer 510 and the second spacer 512 may include an adhesive. The first spacer 510 and the second spacer 512, each may have a square shape. The second spacer 512 is bigger than the first spacer 510. However, the first spacer 510 and the second spacer 512 may have different shapes and sizes.

FIG. 8 also illustrates a state after the first PCM 520 is provided (e.g., formed) in a space and/or region defined by the first spacer 510 and the first heat spreader layer 502. The second PCM 522 is provided (e.g., formed) in a space and/or region defined by the first spacer 510, the second spacer 512 and the first heat spreader layer 502. Different implementations may use similar or different materials for the first PCM 520 and the second PCM 522. For example, in some implementations, the first PCM 520 has a higher melting temperature than a melting temperature of the second PCM 522. As mentioned above, in some implementations, the first PCM 520 may be selected such that the first PCM 520 has a first melting temperature that is higher than the other PCMs in the heat dissipating device, in order to follow the temperature gradient inside the device (e.g., near the heat generating region).

FIG. 9 illustrates a state after the third spacer 514 and the fourth spacer 516 are coupled to a second surface of the second heat spreader layer 504. An adhesive (e.g., thermally conductive adhesive, insulative adhesive) may be used to couple the third spacer 514 and the fourth spacer 516 to the second heat spreader layer 504. In some implementations, the third spacer 514 and the fourth spacer 516 may include an adhesive. The third spacer 514 and the fourth spacer 516 each may have a square shape. The fourth spacer 516 is bigger than the third spacer 514. However, the third spacer 514 and the fourth spacer 516 may have different shapes and sizes.

FIG. 9 also illustrates a state after the third PCM 524 is provided (e.g., formed) in a space and/or region defined by the third spacer 514 and the second heat spreader layer 504. The fourth PCM 526 is provided (e.g., formed) in a space and/or region defined by the third spacer 514, the fourth spacer 516 and the second heat spreader layer 504. Different implementations may use similar or different materials for the third PCM 524 and the fourth PCM 526. For example, in some implementations, the third PCM 524 has a higher melting temperature than the melting temperature of the fourth PCM 526. As mentioned above, in some implementations, the third PCM 524 may be selected such that the third PCM 524 has a third melting temperature that is higher than the fourth PCM 526, but less than the other PCMs (e.g., first PCM 520, second PCM 522) in the heat dissipating device, in order to follow the temperature gradient inside the device (e.g., near the heat generating region).

FIG. 9 further illustrates the second heat spreader layer 504 being coupled to the first spacer 510 and the second spacer 512. An adhesive (e.g., thermally conductive adhesive, insulative adhesive) may be used to couple the second heat spreader layer 504 to the first spacer 510 and the second spacer 512.

FIG. 10 illustrates a state where the third heat spreader layer 506 is being coupled to the third spacer 514 and the fourth spacer 516. An adhesive (e.g., thermally conductive adhesive, insulative adhesive) may be used to couple the third heat spreader layer 506 to the third spacer 514 and the fourth spacer 516.

Figure 11:
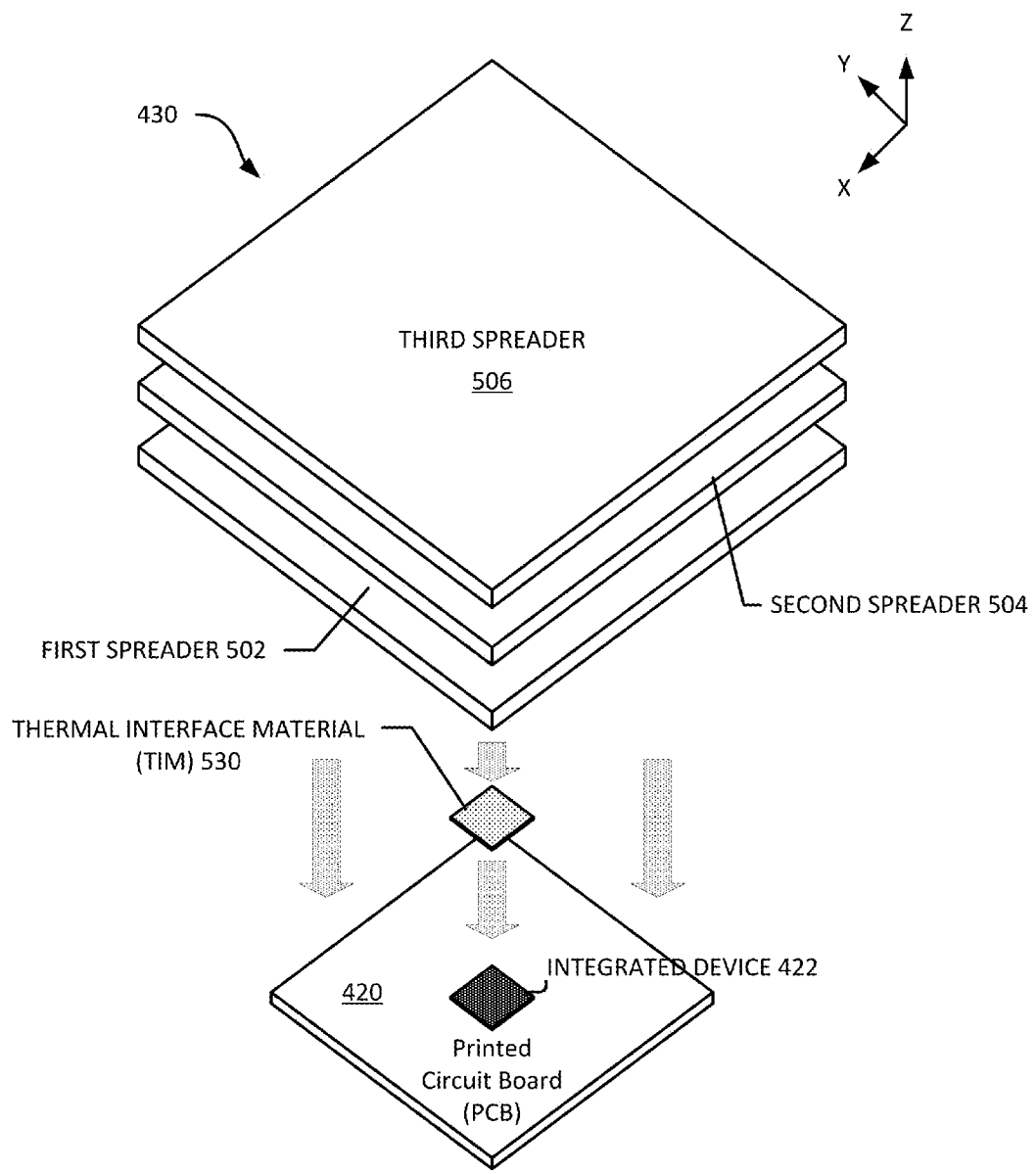
FIG. 11 illustrates a multi-layer heat dissipating device, that includes at least one phase change material (PCM), being coupled to an integrated device.

FIG. 11 illustrates a state where the multi-layer heat dissipating device 430 being coupled to the integrated device 422 through the thermal interface material (TIM) 530. As shown, the first surface of the first heat spreader layer 502 is coupled to the integrated device 422 through the thermal interface material (TIM) 530. In some implementations, the thermal interface material (TIM) 530 is optional.

Exemplary Method for Fabricating a Multi-Layer Heat Dissipating Device Comprising a Phase Change Material (PCM)

Figure 12:
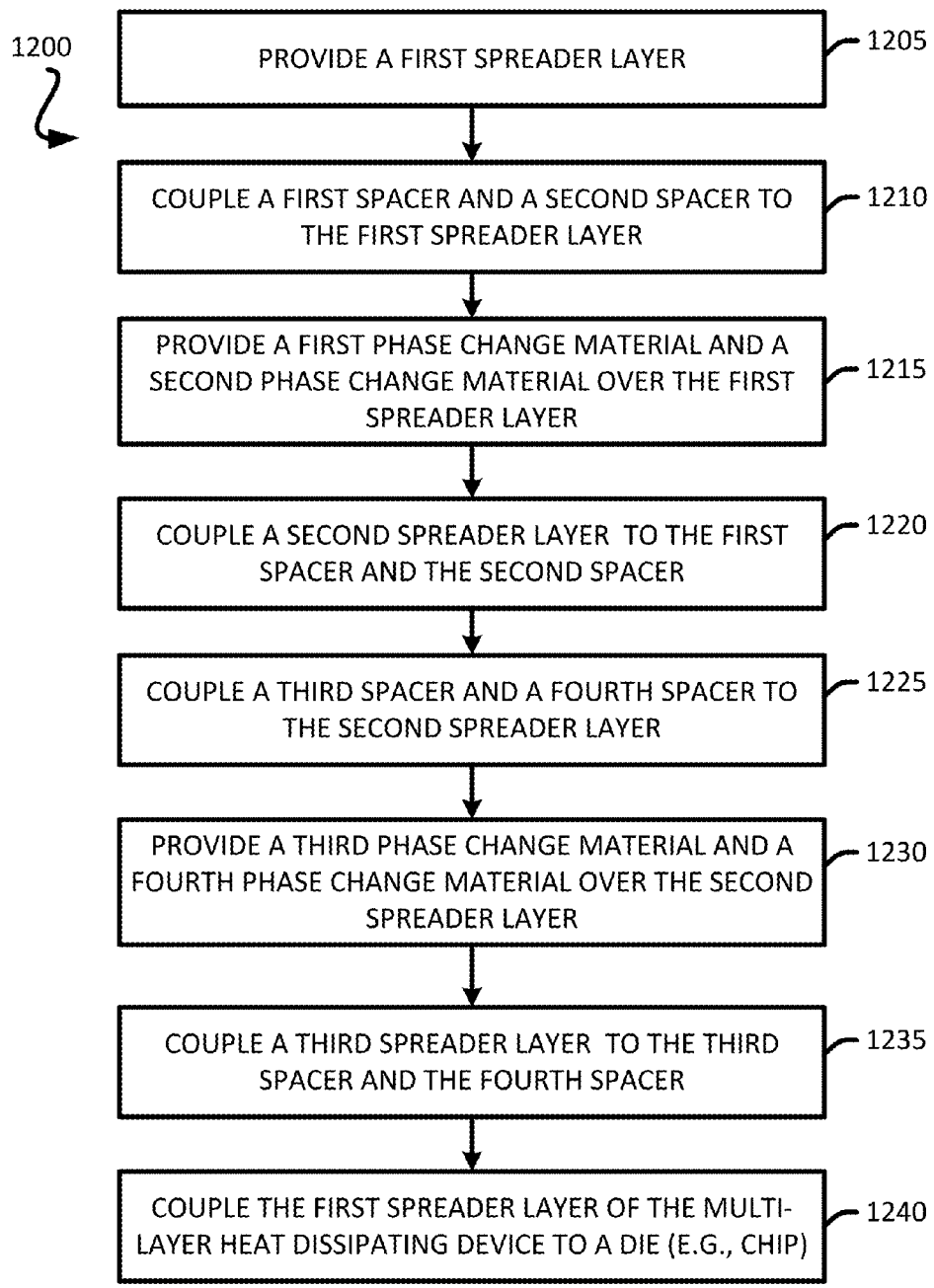
FIG. 12 illustrates a flow diagram of a method for assembling a multi-layer heat dissipating device.

FIG. 12 illustrates an exemplary method 1200 for providing/fabricating a multi-layer heat dissipating device that includes at least one phase change material (PCM). The method of FIG. 12 may be used to fabricate any of the multi-layer heat dissipating devices described in the present disclosure. It is noted that the order of the method 1200 may be changed and/or that some or all of the processes can be combined or separated in other processes. In some implementations, one or more components (e.g., third heat spreader layer, spacer, PCM) may be omitted or substituted.

As shown in FIG. 12, the method provides (at 1205) a first heat spreader layer (e.g., first heat spreader layer 502, first means for spreading heat). The first heat spreader layer includes a first surface and a second surface opposite of the first surface. In some implementations, providing the first heat spreader layer includes fabricating/manufacturing the first heat spreader layer. In some implementations, the first heat spreader layer is a high thermal conductivity heat spreader layer.

The method couples (at 1210) a first spacer (e.g., first spacer 510) and a second spacer (e.g., second spacer 512) to a second surface of the first heat spreader layer. In some implementations, coupling the first spacer and the second spacer includes fabricating/manufacturing and coupling (e.g., placing) the first spacer and the second spacer to the second surface of the first heat spreader layer. In some implementations, an adhesive layer (e.g., thermally conductive adhesive, insulative adhesive) is used to couple the first spacer and the second spacer to the first heat spreader layer. In some implementations, the first spacer and/or the second spacer are a thermally conductive adhesive layer.

The method provides (at 1215) a first phase change material (PCM) (e.g., first PCM 520, first means for storing heat) and a second phase change material (PCM) (e.g., second PCM 522, second means for storing heat) over the first heat spreader layer. The first PCM is provided over the second surface of the first heat spreader layer in a space and/or region defined by the first spacer. The second PCM is provided on the second surface of the first heat spreader in a spacer and/or region defined by the first spacer and the second spacer. Different implementations may use similar or different materials for the first PCM and/or the second PCM. In some implementations, only one of the PCMs is provided. In some implementations, no PCM is provided on the first heat spreader layer.

The method couples (at 1220) a second heat spreader layer (e.g., second heat spreader layer 504, second means for spreading heat) to the first spacer and the second spacer. For example, the first surface of the second heat spreader layer may be coupled to the first spacer and the second spacer. An adhesive layer (e.g., thermally conductive adhesive, insulative adhesive) may be used to couple the second heat spreader layer to the first spacer and the second spacer. In some implementations, the first spacer and/or the second spacer are a thermally conductive adhesive layer.

The method couples (at 1225) a third spacer (e.g., third spacer 514) and a fourth spacer (e.g., fourth spacer 516) to a second surface of the second heat spreader layer 504. In some implementations, an adhesive layer (e.g., thermally conductive adhesive) is used to couple the third spacer and the fourth spacer to the second heat spreader layer. In some implementations, the third spacer and/or the fourth spacer are a thermally conductive adhesive layer.

The method provides (at 1230) a third phase change material (PCM) (e.g., third PCM 524, third means storing heat) and a fourth phase change material (PCM) (e.g., fourth PCM 526, fourth means storing heat) on the second heat spreader layer. The third PCM is provided on the second surface of the second heat spreader layer in a space and/or region defined by the third spacer. The fourth PCM is provided over the second surface of the second heat spreader in a spacer and/or region defined by the third spacer and the fourth spacer. Different implementations may use similar or different materials for the third PCM and/or the fourth PCM. In some implementations, only one of the PCMs is provided. In some implementations, no PCM is provided over the second heat spreader layer.

The method couples (at 1235) a third heat spreader layer (e.g., third heat spreader layer 506, third means for spreading heat) to the third spacer and the fourth spacer. For example, the first surface of the third heat spreader layer may be coupled to the third spacer and the fourth spacer. An adhesive layer (e.g., thermally conductive adhesive, insulative adhesive) may be used to couple the third heat spreader layer to the third spacer and the fourth spacer. In some implementations, the third spacer and/or the fourth spacer are a thermally conductive adhesive layer.

In some implementations, the method may further couple (at 1240) a first surface of the first heat spreader layer (e.g., first heat spreader layer 502) of the multi-layer heat dissipating device 430 to one or more heat generating components, a heat generating region and/or region configured to generate heat. In some implementations, the heat generating components include an integrated device (e.g., die, die package, CPU, GPU) and/or printed circuit board (PCB). In some implementations, the heat generating region includes an integrated device (e.g., die, die package) and/or printed circuit board (PCB).

Transient Temperatures of Electronic Device

FIGS. 13, 14 and 15 illustrate three graphs of various transient temperatures for various configurations at various locations of an electronic device. It is noted that FIG. 13, 14, 15 are merely examples of possible transient temperatures. Different implementations and configurations may result in different transient temperatures.

FIG. 13 illustrates a graph of various transient temperatures for various configurations at the integrated device (e.g., transient junction temperatures). More specifically, FIG. 13 illustrates the transient temperatures at the integrated device for three configurations of a heat dissipating device; (1) a heat spreader layer and a spacer; (2) a heat spreader layer, a spacer and a PCM; and (3) a heat spreader layer, a spacer, and a plastic (which replaces a PCM). As shown in FIG. 13, the heat dissipating device that includes a heat spreader layer, a spacer and a PCM provides better heat dissipation away from the integrated device and thus a lower junction temperature at the integrated device versus the configuration with air and no PCM. FIG. 13 illustrates that before around 275 seconds of operation of the integrated device, the configuration that includes the plastic and the configuration that includes the PCM provide similar heat dissipating capabilities. However, around 275 seconds of operation, the configuration that includes the PCM starts to provide better heat dissipating capabilities until over 700 seconds.

FIG. 14 illustrates the transient temperatures at the back side surface (e.g., back side cover) of the device for three configurations of a heat dissipating device; (1) a heat spreader layer and a spacer; (2) a heat spreader layer, a spacer and a PCM; and (3) a heat spreader layer, a spacer, and a plastic (which replaces the PCM). As shown in FIG. 14, the heat dissipating device that includes a heat spreader layer, a spacer and a PCM provides better heat dissipation and thus a lower temperature at the back side surface (e.g., back side cover) of the device versus the backside of the device without PCM (air only). FIG. 14 illustrates that before around 250 seconds of operation of the integrated device, the configuration that includes the plastic and the configuration that includes the PCM provide similar heat dissipating capabilities. However, around 250 seconds of operation, the configuration that includes the PCM starts to provide better heat dissipating capabilities until over 700 seconds. The better performance can be attributed to the PCM being able to take heat away from the integrated device and store it (e.g., temporarily store it) instead of immediately dissipating it through the back side surface of the device.

FIG. 15 illustrates the transient temperatures at the front side surface (e.g., display side) of the device for three configurations of a heat dissipating device; (1) a heat spreader layer and a spacer; (2) a heat spreader layer, a spacer and a PCM; and (3) a heat spreader layer, a spacer, and a plastic (which replaces a PCM). As shown in FIG. 15, the heat dissipating device that includes a heat spreader layer and a spacer provides better heat dissipation away from the front side surface and thus a lower temperature at the front side surface (e.g., display side) of the device. However, the design of the heat dissipating device that includes the PCM is designed in such a way as to dissipate as much heat as possible away from the integrated device, but also limit how much heat is dissipated through the back side of the device. Thus, heat that is dissipated away from the integrated device is directed towards the front side (e.g., display side) of the device. Since a user will normally hold a device on the back side of the device, an increased temperature of the display side may not be as problematic as an increased in temperature of the back side surface. FIG. 15 illustrates that the configuration that includes the heat spreader layer and the spacer does a better job at lowering the front side temperature. However, this is because this configuration dissipates more heat through the back side surface (as shown in FIG. 14), which as mentioned is not desirable. As shown in FIG. 15, the configuration that includes a PCM is better than the configuration that includes a plastic case in instances over 700 seconds and is comparable for the configuration that includes air for instances of about 450 seconds.

FIG. 15 illustrates that before around 200 seconds of operation, the configuration that includes the plastic and the configuration that includes the PCM provide similar heat dissipating capabilities. This is because melting has not yet begun in the PCM, prior to around 200 seconds. However, after 200 seconds of operation, the configuration that includes the PCM provides better heat dissipating capabilities than the configuration that includes the plastic, for instances over 700 seconds due to the melting of the PCM material.

FIGS. 13, 14 and 15 illustrate examples of how the use of one or more PCMs can help improve heat dissipation and provide controlled directional heat dissipation, and thus lower peak temperatures at various locations of a device through the PCMs' capabilities to store heat and delay the release of the dissipated heat.

Exemplary Electronic Devices

Figure 16:
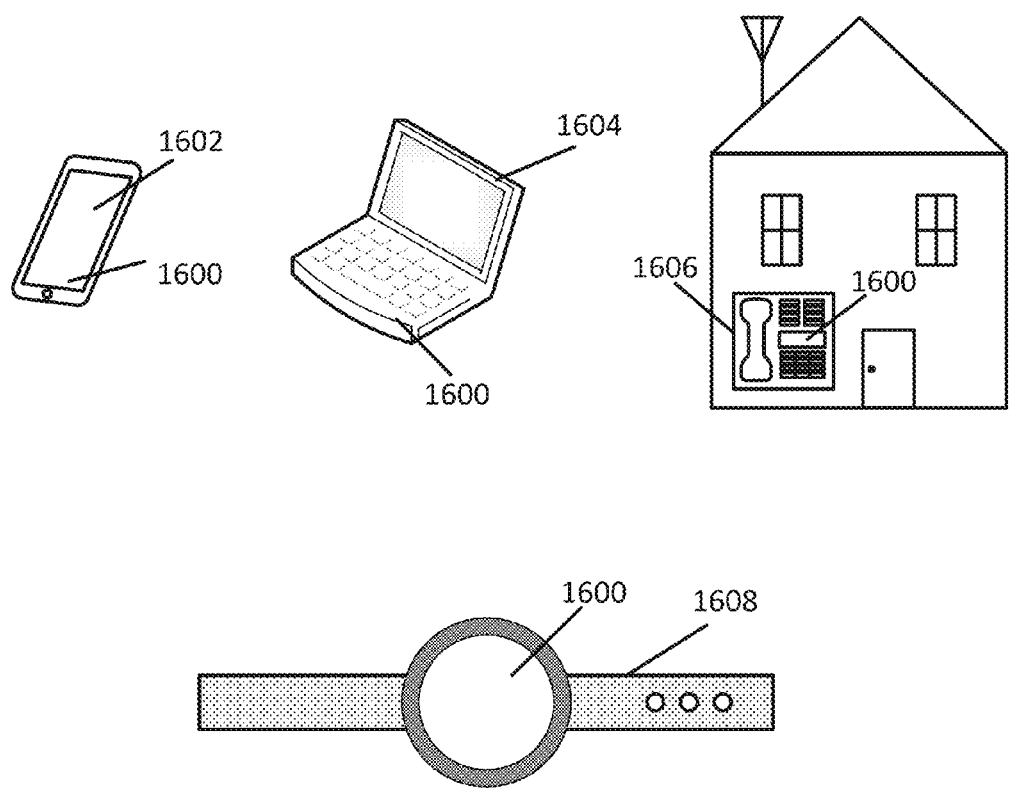
FIG. 16 illustrates various electronic devices that may integrate a heat dissipating device, a semiconductor device, an integrated device, a die, an integrated circuit, a PCB and/or a multi-layer heat spreader described herein.

FIG. 16 illustrates various electronic devices that may be integrated with any of the aforementioned heat dissipating device, integrated device, semiconductor device, integrated circuit, die, interposer, package or package-on-package (PoP). For example, a mobile phone device 1602, a laptop computer device 1604, a fixed location terminal device 1606, a wearable device 1608 may include an integrated device 1600 as described herein. The integrated device 1600 may be, for example, any of the integrated circuits, dies, integrated devices, integrated device packages, integrated circuit devices, device packages, integrated circuit (IC) packages, package-on-package devices described herein. The devices 1602, 1604, 1606, 1608 illustrated in FIG. 16 are merely exemplary. Other electronic devices may also feature the integrated device 1600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 4, 5, 6, 7, 8, 9, 10, 11, 12, 13, 14, 15 and/or 16 may be rearranged and/or combined into a single component, process, feature or function or embodied in several components, processes, or functions. Additional elements, components, processes, and/or functions may also be added without departing from the disclosure. It should also be noted that FIGS. 4, 5, 6, 7, 8, 9, 10, 11, 12, 13, 14, 15 and/or 16 and its corresponding description in the present disclosure is not limited to dies and/or ICs. In some implementations, FIGS. 4, 5, 6, 7, 8, 9, 10, 11, 12, 13, 14, 15 and/or 16 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A multi-layer heat dissipating device comprising:
   a first heat spreader layer configured to be coupled to a region configured to generate heat;
   a second heat spreader layer;
   a first spacer coupled to the first heat spreader layer and the second heat spreader layer;
   a first phase change material (PCM) located between the first heat spreader layer, the second heat spreader layer, and the first spacer, wherein the first PCM comprises a first melting temperature;
   a second spacer coupled to the first heat spreader layer and the second heat spreader layer; and
   a second phase change material (PCM) located between the first heat spreader layer, the second heat spreader layer, the first spacer and the second spacer, wherein the second PCM comprises a second melting temperature,
   wherein the first phase change material (PCM) is closer to the region configured to generate heat than the second phase change material (PCM),
   wherein the first phase change material (PCM) has a higher melting temperature than the second phase change material (PCM).

2. The multi-layer heat dissipating device of claim 1, further comprising:
   a third heat spreader layer;
   a third spacer coupled to the second heat spreader layer and the third heat spreader layer; and
   a third phase change material (PCM) located between the second heat spreader layer and the third heat spreader layer, wherein the third PCM is surrounded by the third spacer.

3. The multi-layer heat dissipating device of claim 2, further comprising:
   a fourth spacer coupled to the second heat spreader layer and the third heat spreader layer; and
   a fourth phase change material (PCM) located between the second heat spreader layer, the third heat spreader layer, the third spacer and the fourth spacer.

4. The multi-layer heat dissipating device of claim 3, wherein the third PCM comprises a third melting temperature, and the fourth PCM comprises a fourth melting temperature, and wherein the first melting temperature of the first PCM is greater than the second melting temperature, the third melting temperature and the fourth temperature.

5. The multi-layer heat dissipating device of claim 1, wherein the first spacer comprises a thermally conductive adhesive layer and/or a thermally insulative layer.

6. The multi-layer heat dissipating device of claim 1, wherein the first heat spreader layer is coupled to a heat generating component through a thermal interface material.

7. The multi-layer heat dissipating device of claim 1, wherein the multi-layer heat dissipating device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

8. An apparatus comprising:
   a first means for spreading heat configured to be coupled to a region configured to generate heat;
   a second means for spreading heat;
   a first spacer coupled to the first means for spreading heat and the second means for spreading heat;
   a first means for storing heat located between the first means for spreading heat, the second means for spreading heat, and the first spacer, wherein the first means for storing heat comprises a first melting temperature;

a second spacer coupled to the first means for spreading heat and the second means for spreading heat; and
a second means for storing heat located between the first means for spreading heat, the second means for spreading heat, the first spacer and the second spacer, wherein the second means for storing heat comprises a second melting temperature,
wherein the first means for storing heat is closer to the region configured to generate heat than the second means for storing heat,
wherein the first means for storing heat has a higher melting temperature than the second means for storing heat.

9. The apparatus of claim 8, further comprising:
a third means for spreading heat;
a third spacer coupled to the second means for spreading heat and the third means for spreading heat; and
a third means for storing heat located between the second means for spreading heat and the third means for spreading heat, wherein the third means for storing heat is surrounded by the third spacer.

10. The apparatus of claim 9, further comprising:
a fourth spacer coupled to the second means for spreading heat and the third means for spreading heat; and
a fourth means for storing heat located between the second means for spreading heat, the third means for spreading heat, the third spacer and the fourth spacer.

11. The apparatus of claim 10, wherein the third means for storing heat comprises a third melting temperature, and the fourth means for storing heat comprises a fourth melting temperature, and wherein the first melting temperature of the first means for storing heat is greater than the second melting temperature, the third melting temperature and the fourth temperature.

12. The apparatus of claim 8, wherein the first spacer comprises a thermally conductive adhesive layer and/or a thermally insulative layer.

13. The apparatus of claim 8, wherein the first means for spreading heat is coupled to a heat generating component through a thermal interface material.

14. The apparatus of claim 8, wherein the apparatus is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

15. A device comprising:
a region configured to generate heat, the region comprising an integrated device;
a first heat spreader layer coupled to the region;
a second heat spreader layer;
a first spacer coupled to the first heat spreader layer and the second heat spreader layer;
a first phase change material (PCM) located between the first heat spreader layer, the second heat spreader layer, and the first spacer, wherein the first PCM comprises a first melting temperature;
a second spacer coupled to the first heat spreader layer and the second heat spreader layer; and
a second phase change material (PCM) located between the first heat spreader layer, the second heat spreader layer, the first spacer and the second spacer, wherein the second PCM comprises a second melting temperature,
wherein the first phase change material (PCM) is closer to the region configured to generate heat than the second phase change material (PCM),
wherein the first phase change material (PCM) has a higher melting temperature than the second phase change material (PCM).

16. The device of claim 15, further comprising:
a third heat spreader layer;
a third spacer coupled to the second heat spreader layer and the third heat spreader layer; and
a third phase change material (PCM) located between the second heat spreader layer and the third heat spreader layer, wherein the third PCM is surrounded by the third spacer.

17. The device of claim 16, further comprising:
a fourth spacer coupled to the second heat spreader layer and the third heat spreader layer; and
a fourth phase change material (PCM) located between the second heat spreader layer, the third heat spreader layer, the third spacer and the fourth spacer.

18. The device of claim 17, wherein the third PCM comprises a third melting temperature, and the fourth PCM comprises a fourth melting temperature, and wherein the first melting temperature of the first PCM is greater than the second melting temperature, the third melting temperature and the fourth temperature.

19. The device of claim 15, wherein the first spacer comprises a thermally conductive adhesive layer and/or thermally insulative layer.

20. The device of claim 15, wherein the first heat spreader layer is coupled to the integrated device through a thermal interface material.

21. The device of claim 15, wherein the region comprises a printed circuit board (PCB) coupled to the integrated device.

22. The device of claim 15, wherein the device is a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

23. The multi-layer heat dissipating device of claim 1, wherein the first phase change material (PCM) provides a mechanism for storing heat and a mechanism for delaying the release of heat.

24. The multi-layer heat dissipating device of claim 1, wherein the first heat spreader layer, the second heat spreader layer and the first spacer provide a hermetically sealed region for the first phase change material (PCM).

25. The multi-layer heat dissipating device of claim 4, wherein a particular phase change material (PCM) that is closer to the region configured to generate heat, has a higher melting temperature than another phase change material (PCM) that is farther away from the region configured to generate heat.

26. The apparatus of claim 8, wherein for means for storing heat between the first means for spreading heat and the second means for spreading heat, a particular means for storing heat that is closer to the region configured to generate heat, has a higher melting temperature than another means for storing heat that is farther away from the region configured to generate heat.

27. The device of claim 15, wherein for phase change materials (PCMs) between the first heat spreader layer and the second heat spreader layer, a particular phase change material (PCM) that is closer to the region configured to generate heat, has a higher melting temperature than another phase change material (PCM) that is farther away from the region configured to generate heat.

* * * * *